(12) United States Patent
Akizuki et al.

(10) Patent No.: US 9,543,760 B2
(45) Date of Patent: Jan. 10, 2017

(54) POWER DISTRIBUTION CIRCUIT

(75) Inventors: Taiji Akizuki, Miyagi (JP); Junji Sato, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 513 days.

(21) Appl. No.: 14/125,438

(22) PCT Filed: Jul. 17, 2012

(86) PCT No.: PCT/JP2012/004568
§ 371 (c)(1),
(2), (4) Date: Dec. 11, 2013

(87) PCT Pub. No.: WO2013/014881
PCT Pub. Date: Jan. 31, 2013

(65) Prior Publication Data
US 2014/0125126 A1 May 8, 2014

(30) Foreign Application Priority Data

Jul. 27, 2011 (JP) .................................. 2011-164742

(51) Int. Cl.
| | | |
|---|---|---|
| H02J 3/00 | (2006.01) |
| H01P 5/12 | (2006.01) |
| H03F 3/21 | (2006.01) |
| H03F 3/45 | (2006.01) |
| H03H 7/42 | (2006.01) |
| H03H 7/09 | (2006.01) |

(52) U.S. Cl.
CPC . *H02J 3/00* (2013.01); *H01P 5/12* (2013.01); *H03F 3/211* (2013.01);
(Continued)

(58) Field of Classification Search
None
See application file for complete search history.

(56) References Cited

U.S. PATENT DOCUMENTS 6,819,722 B2 * 11/2004 Hatakeyama ...... H04B 10/6933
375/318
6,927,629 B2    8/2005 Tomita
(Continued)

FOREIGN PATENT DOCUMENTS

JP    08-21820 B2    3/1996
JP    10-163809 A    6/1998
(Continued)

OTHER PUBLICATIONS

International Search Report for Application No. PCT/JP2012/004568 dated Oct. 30, 2012.

*Primary Examiner* — Jared Fureman
*Assistant Examiner* — Aqeel Bukhari
(74) *Attorney, Agent, or Firm* — Pearne & Gordon LLP

(57) ABSTRACT

A transformer (2A) outputs differential signals of a positive phase signal (Vout2Ap) having phase θ1+90° and a negative phase signal (Vout2An) having phase θ1−90°. A transformer (2B) outputs differential signals of a positive phase signal (Vout2Bp) having phase θ2+90° and a negative phase signal (Vout2Bn) having phase θ2−90°. An adding circuit (3) composes a pair of differential output signals, as signals corrected in phase error (θ1−θ2) generated in the transformers (2A, 2B), in a manner of summing up vectors of two pairs of the differential signals outputted from the transformers (2A, 2B) for the positive phase signal and the negative phase signal, respectively.

10 Claims, 12 Drawing Sheets

(52) U.S. Cl.
CPC ..... *H03F 3/45085* (2013.01); *H03F 3/45183* (2013.01); *H03H 7/42* (2013.01); *H03F 2200/06* (2013.01); *H03F 2200/192* (2013.01); *H03F 2200/204* (2013.01); *H03F 2200/411* (2013.01); *H03F 2200/534* (2013.01); *H03F 2200/537* (2013.01); *H03F 2200/541* (2013.01); *H03F 2203/45644* (2013.01); *H03F 2203/45702* (2013.01); *H03F 2203/45731* (2013.01); *H03H 7/09* (2013.01); *Y10T 307/305* (2015.04)

(56) References Cited

U.S. PATENT DOCUMENTS

| | | | |
|---|---|---|---|
| 7,577,416 B2 | 8/2009 | Kimishima | |
| 7,587,652 B2 | 9/2009 | Nishizawa et al. | |
| 7,592,866 B2 * | 9/2009 | Meharry | H03F 3/602 |
| | | | 330/165 |

FOREIGN PATENT DOCUMENTS

| | | | |
|---|---|---|---|
| JP | 11-214943 | A | 8/1999 |
| JP | 2001-196862 | A | 7/2001 |
| JP | 2001-358546 | A | 12/2001 |
| JP | 2002-329611 | A | 11/2002 |
| JP | 2005-130376 | A | 5/2005 |
| JP | 2005-348054 | A | 12/2005 |
| JP | 4166787 | B2 | 8/2008 |
| WO | 2008/105257 | A1 | 9/2008 |

\* cited by examiner

FIG. 3
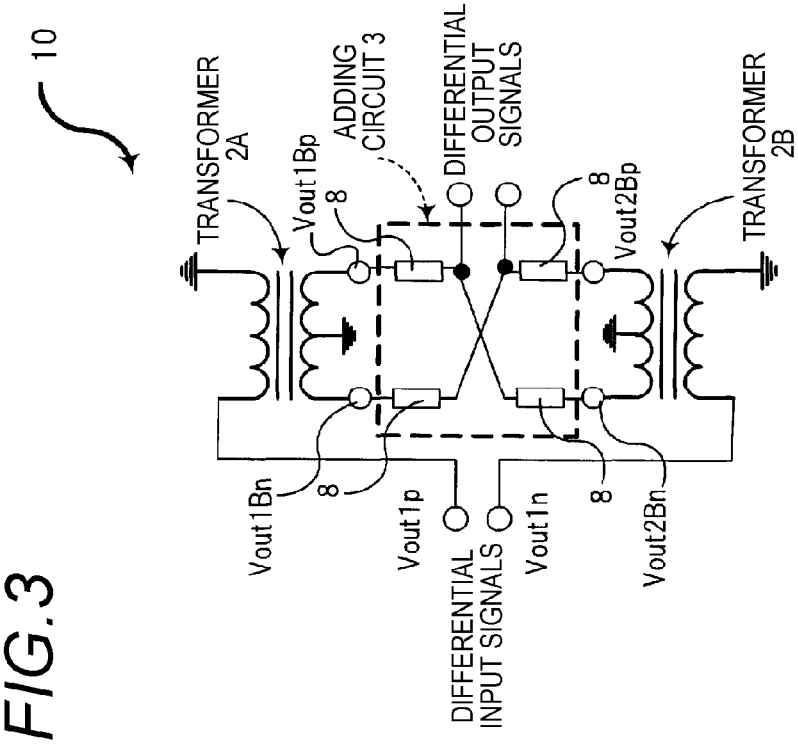
(b)
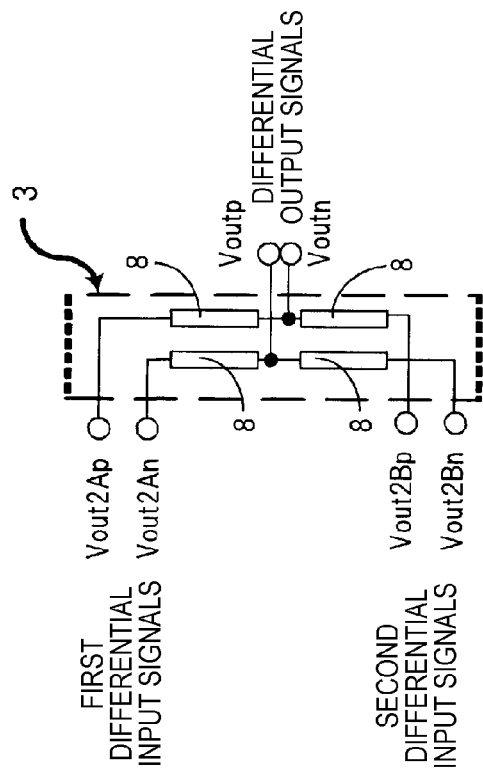
(a)

POWER DISTRIBUTION CIRCUIT

TECHNICAL FIELD

The present invention relates to a power distribution circuit which receives an input of differential input signals and outputs a pair of differential output signals.

BACKGROUND ART

In recent years, in the wireless communication standard for high-speed transmission such as WiGig (Wireless Gigabit) standard using millimeter-wave band signals, the degradation (error, for example) of the characteristic of a radio frequency circuit part has increasingly influenced on the communication performance.

Thus, when the radio frequency circuit part performs unbalance-to-balance transformation (balun) on an input signal from an antenna, since high accuracy is required as to error between differential output signals outputted by the unbalance-to-balance transformation (balun), a circuit system for reducing the error has become important.

Circuits for reducing the error between the differential output signals generated by the unbalance-to-balance transformation (balun) have been known (see Patent Literature 1, for example).

CITATION LIST

Patent Literature

Patent Literature 1: Japanese Patent No. 4166787

SUMMARY OF INVENTION

Technical Problem

Inventors of the present application have studied a power distribution circuit for reducing the error between the differential outputs generated by the unbalance-to-balance transformation (balun). However, even if the power distribution circuit of the related art is employed, it has been difficult to obtain the power distribution circuit arranged to sufficiently reduce the error between the differential outputs.

Accordingly, in order to solve the aforesaid problem, the disclosure provides a power distribution circuit which can further reduce the error between the differential outputs generated by the unbalance-to-balance transformation (balun).

Solution to Problem

The present invention provides a power distribution circuit for receiving an input of a pair of differential input signals and outputting a pair of differential output signals, the power distribution circuit including: a first unbalance-to-balance transformer, configured to receive an input of a positive phase signal of the pair of differential input signals and output differential signals; a second unbalance-to-balance transformer, configured to receive an input of a negative phase signal of the pair of differential input signals and output differential signals; and an adding circuit, configured to add the positive phase signals each other and add the negative phase signals each other among two pairs of the differential signals outputted from the first and second unbalance-to-balance transformers to thereby output the pair of differential output signals.

Advantageous Effects of Invention

According to the present invention, at the time of outputting the pair of differential output signals, circuit error between the differential output signals can be reduced without increasing circuit size nor consumption current and also without degrading radio efficiency.

BRIEF DESCRIPTION OF DRAWINGS

In FIG. 3, (a) is a diagram showing an example of the configuration of the adding circuit, and (b) is a diagram showing another example of the configuration of the adding circuit.

MODES FOR CARRYING OUT INVENTION

Embodiments of a power distribution circuit according to the present invention will be explained with reference to drawings. The power distribution circuits according to the embodiments are applicable to a radio circuit which receives, via an antenna, a signal with a frequency band of millimeter wave or microwave, for example.

Background for the Disclosure

Figure 10:
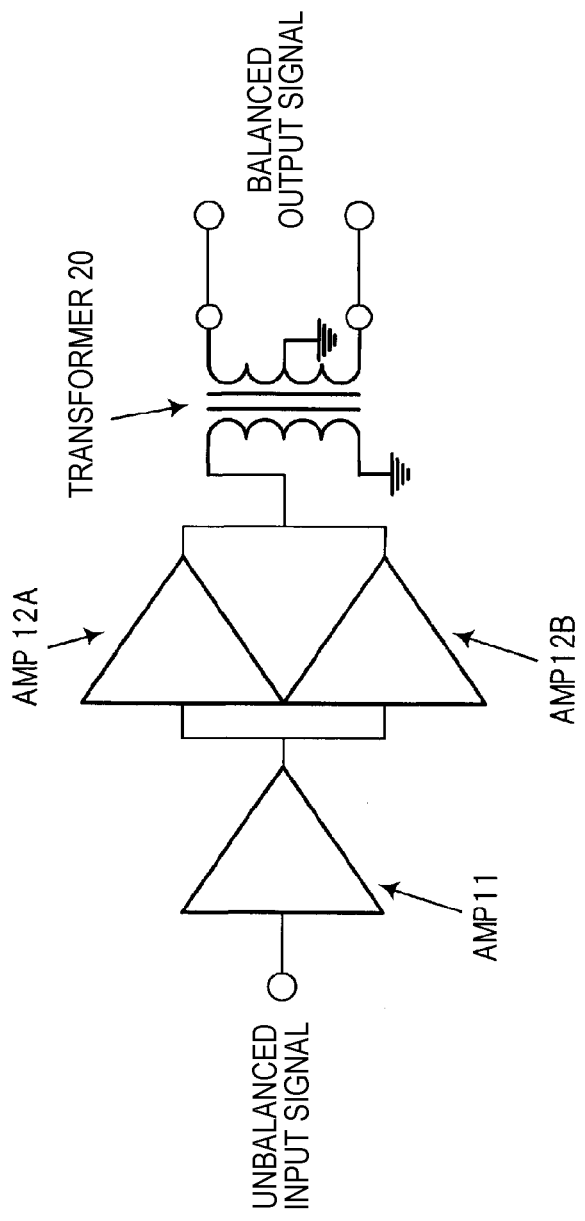
FIG. 10 is a circuit diagram showing the configuration of a differential amplifier circuit using a generally-known circuit of a related art for performing unbalance-to-balance transformation (balun).

FIG. 10 is a circuit diagram showing the configuration of a differential amplifier circuit using a generally-known circuit of a related art for performing unbalance-to-balance transformation (balun). The differential amplifier circuit is configured to include an initial-stage amplifier AMP11, next-stage amplifiers AMP12A, 12B connected in parallel, and a transformer 20. The differential amplifier circuit amplifies an unbalanced input signal by an amplifier using the initial-stage amplifier AMP11 and the next-stage amplifiers AMP12A, 12B. Further, after amplifying the unbalanced input signal, the differential amplifier circuit converts the output signal of the amplifier into differential output signals (balanced output signal) by using the transformer 20 for the unbalance-to-balance transformation (balun) and outputs the differential output signal.

In the differential amplifier circuit shown in FIG. 10, since the transformer 20 performs the unbalance-to-balance transformation (balun), error between the differential output signals of the transformer 20 itself is outputted as error of the differential amplifier circuit outputting the differential output signals.

Figure 11:
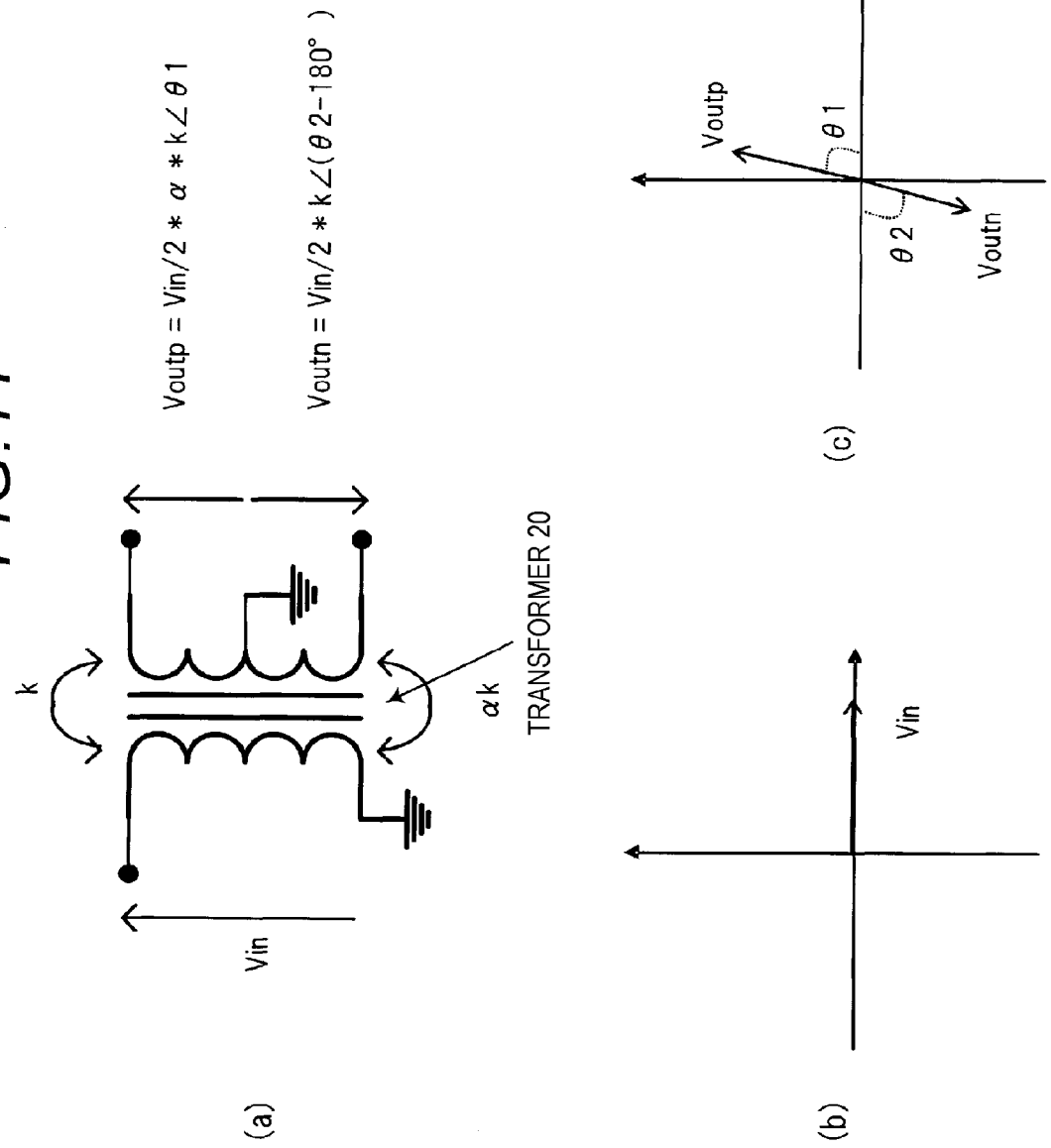
In FIG. 11, (a) is an explanatory diagram for explaining error between differential output signals based on a transformer in a differential amplifier circuit of the related art, (b) is an explanatory diagram showing an input signal amplitude Vin, and (c) is an explanatory diagram showing output signal amplitudes Voutp, Voutn and phases $\theta1$, $\theta2$.

FIG. 11(a) is an explanatory diagram for explaining error between the differential output signals based on the transformer 20 in the differential amplifier circuit of the related art. FIG. 11(b) is an explanatory diagram showing an input signal amplitude Vin. FIG. 11(c) is an explanatory diagram showing output signal amplitudes Voutp, Voutn and phases $\theta1$, $\theta2$. In FIG. 11(a), the differential output signals of the transformer 20 are represented by a numerical expression (1).

[Expression 1]

$$Voutn = Vin/2 \times k \angle (\theta2 - 180°)$$

$$Voutp = Vin/2 \times \alpha \times k \angle \theta1 \quad (1)$$

In the numerical expression (1), a parameter k represents a coupling coefficient ($k \leq 1$) between the input signal amplitude Vin and the output signal amplitude Voutn, and a parameter $\alpha$ represents gain error ($\alpha \leq 1$) of the output signal amplitudes Voutp, Voutn. Further, in the numerical expression (1), a parameter $\theta1$ represents a phase of the output signal amplitudes Voutp with respect to a reference phase 0° [degree], and a parameter $\theta2$ represents a phase of the output signal amplitude Voutn with respect to a negative phase 180° [degree] that corresponds to the opposite phase of the reference phase 0° [degree].

In the differential output signals of an ideal transformer (hereinafter referred to as "ideal transformer"), supposing that an input signal amplitude is Vin and output signal amplitudes are Voutp, Voutn, a gain difference between the input and output signals is represented as the coupling coefficient $k = (Voutp - Voutn)/Vin$. Further, a phase difference between the input and output signals is represented as $\theta1 = 90°$ at a positive phase signal end (Vinp) and $\theta2 = 90°$ at a negative phase signal end (Vinn), whereby the phase differences become an opposite phase therebetween. Thus, a phase error $\Delta\theta$, which is a difference of opposing angles of the two output signals between the differential output signals of the ideal transformer, becomes $\theta1 - \theta2 = 0°$.

However, in the actual transformer, wirings between the differential output signals are not arranged in a complete symmetrical manner. Thus, a gain error $\alpha = Voutp/Voutn$ is generated between the differential output signals. Further, since the wirings between the differential output signals are not arranged in the complete symmetrical manner, the output side inductance of the transformer contains an actual resistance component. As a result, the phases of the differential output signals of the transformer do not shift by 90° symmetrically with respect to the GND grounding point, as an origin, at a midpoint on the output side of the transformer, but represent difference values at the positive phase and the negative phase, respectively. Accordingly, in the actual transformer, the phase error $\Delta\theta = \theta1 - \theta2 \neq 0°$ is generated between the differential output signals.

That is, in the actual transformer, the gain error $\alpha = 2$ dB and the phase error $\Delta\theta = 10°$ are generated between the differential output signals, for example. This circuit characteristic is generated as the error of the differential output signals in FIG. 10. Further, this circuit characteristic is not sufficient for the wireless communication standard (WiGig, for example) which requires high-accuracy and specification of the gain error $\alpha \leq 1$ dB and the phase error $\Delta\theta \leq 5°$, for example. As a result, the wireless communication quality is degraded.

Figure 12:
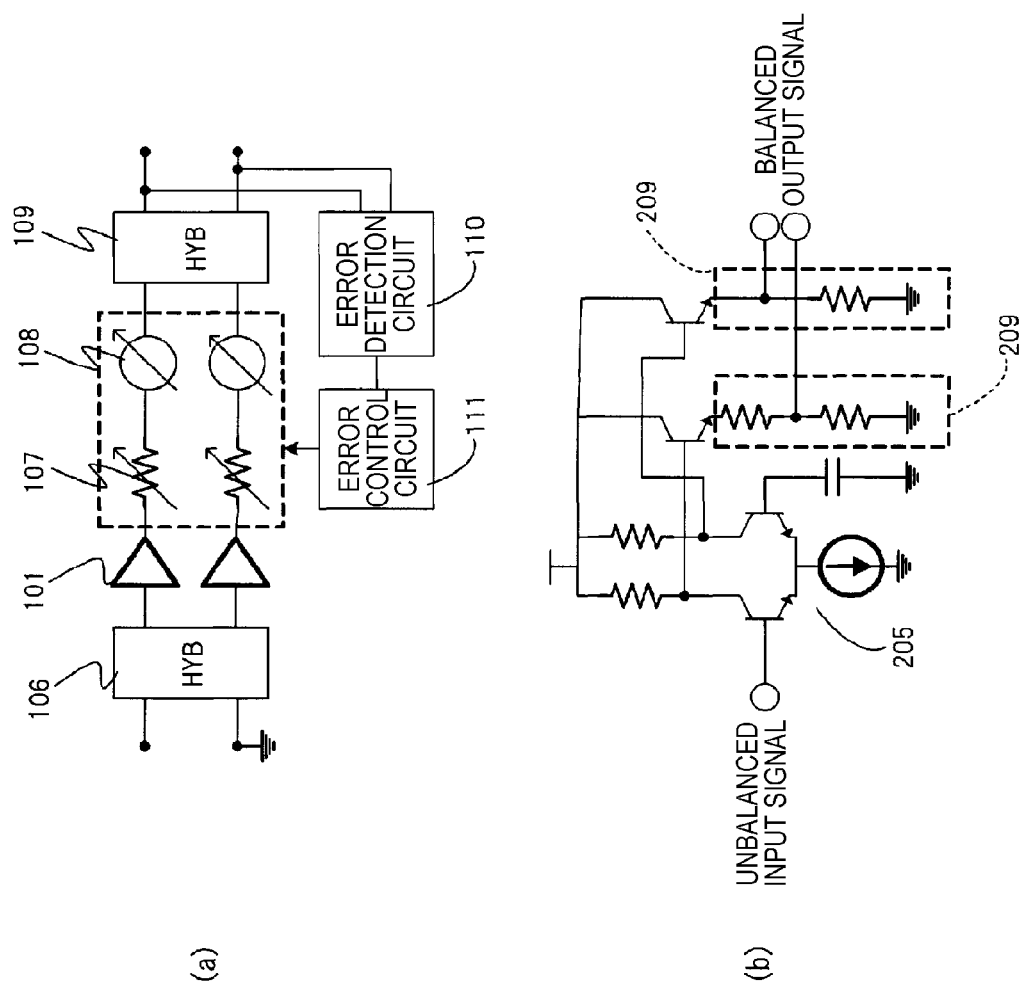
In FIG. 12, (a) is a circuit diagram showing the configuration of a variable power distributor for reducing error between differential output signals that is generated in the unbalance-to-balance transformation (balun) of the related art, and (b) is a circuit diagram showing the configuration of a balance conversion circuit for reducing error between the differential output signals that is generated in the unbalance-to-balance transformation (balun) of the related art.

There has been known a circuit for reducing the error between the differential output signals that is generated in the unbalance-to-balance transformation (balun) (see Patent Literature 1, for example). A variable power distributor of Patent Literature 1 will be explained with reference to FIG. 12(a). FIG. 12(a) is a circuit diagram showing the configuration of the variable power distributor for reducing the error between the differential output signals that is generated in the unbalance-to-balance transformation (balun) of the related art.

The variable power distributor of FIG. 12(a) is configured to include a hybrid circuit (HYB) 106, two amplifiers 101, two variable gain circuits 107, two variable phase circuits 108 and a hybrid circuit 109.

The hybrid circuit 106 divides an unbalanced input signal inputted into the variable power distributor into two unbalanced input signals and outputs the two unbalanced input signals in a manner of shifting the phase therebetween. The two amplifiers 101 amplify two output signals from the hybrid circuit (HYB) 106, respectively. The two variable gain circuits 107 adjust the gains of output signals from the amplifiers 101 connected thereto, respectively.

The two variable phase circuits 108 adjust the phases of output signals from the variable gain circuits 107 connected thereto, respectively. The hybrid circuit 109 sums up again two output signals outputted from the two variable phase circuits 108. The variable power distributor outputs two output signals on which the balance conversion is performed by the summing of the hybrid circuit 109.

The variable power distributor is configured to further include an error detection circuit 110 and an error control circuit 111. The error detection circuit 110 detects phase error and gain error between the two output signals on which the balance conversion is performed by the summing of the hybrid circuit 109. The error control circuit 111 adjusts gains and phases in the variable gain circuits 107 and the variable phase circuits 108, respectively.

Accordingly, the two output signals outputted from the hybrid circuit 109 are corrected by feeding back the error components to the variable gain circuits 107 and the variable phase circuits 108 so as to eliminate the phase error and gain error, respectively. Thus, the variable power distributor can obtain the output signals reduced in the phase error and gain error.

Further, there has been known a balance conversion circuit disclosed in the following Reference Patent Literature 1 as another literature of the related art. FIG. 12(b) is a circuit diagram showing the configuration of the balance conversion circuit for reducing error between differential output signals generated in the unbalance-to-balance transformation (balun) of the related art.

(Reference Patent Literature 1) JP-B-8-21820

The balance conversion circuit is configured to include an amplifier 205 and two emitter-follower circuits 209. The amplifier 205 converts an unbalanced input signal inputted thereto into a differential signal and outputs the differential signal. The two emitter-follower circuits 209 include different load resistors capable of adjusting the differential signals outputted from the amplifier 205, respectively. Each of the two emitter-follower circuits amplifies and outputs the corresponding differential signal outputted from the amplifier 205.

The balance conversion circuit can adjust amplitude error of the differential output signals generated between transistors provided at the output stage of the amplifier 205 in a manner of adjusting the resistance values of the load resistors provided in the two emitter-follower circuits 209. Further, values of parasitic capacitors contained within the load resistors are also changed by adjusting the resistance values of the load resistors. Thus, phase can be adjusted by changing the parasitic capacitance values. The balance conversion circuit can adjust amplitude and phase between the differential output signals outputted from the two emitter-follower circuits 209, thereby obtaining the output reduced in error.

However, the aforesaid variable power distributor of Patent Literature 1 has the following problem. That is, the method for adjusting error in each of gain and phase between the two differential output signals requires the circuit as shown in FIG. 12(a). To be concrete, it is required to provide the error detection circuit for detecting error between the two differential output signals and the error controlling circuit for controlling the variable gain circuits and the variable phase circuits by feeding back the detected errors. Thus, the aforesaid variable power distributor of Patent Literature 1 requires increased circuit size and increased consumption current.

The balance conversion circuit shown in FIG. 12(b) can eliminate the error detection circuit for detecting error between the differential output signals, as compared with the circuit configuration of the variable power distributor shown in FIG. 12(a). However, it is required to add, to the output terminals of the differential output signals, a gain and phase adjustment circuit for adjusting error between the differential output signals and further to adjust initially in advance in order to reduce error between the differential output signals. Further, since the resistors are added so as to adjust the differential output signals by increasing/reducing the resistance values of the load resistors, there arises a problem that gain characteristic or saturation characteristic, for example, as radio efficiency of the amplifier is degraded.

Accordingly, the disclosure of the present invention intends to provide a power distribution circuit which, at the time of inputting a pair of differential input signals and outputting a pair of differential output signals, reduces circuit error between the differential output signals without increasing circuit size nor consumption current and also without degrading radio efficiency.

First Embodiment

Figure 1:
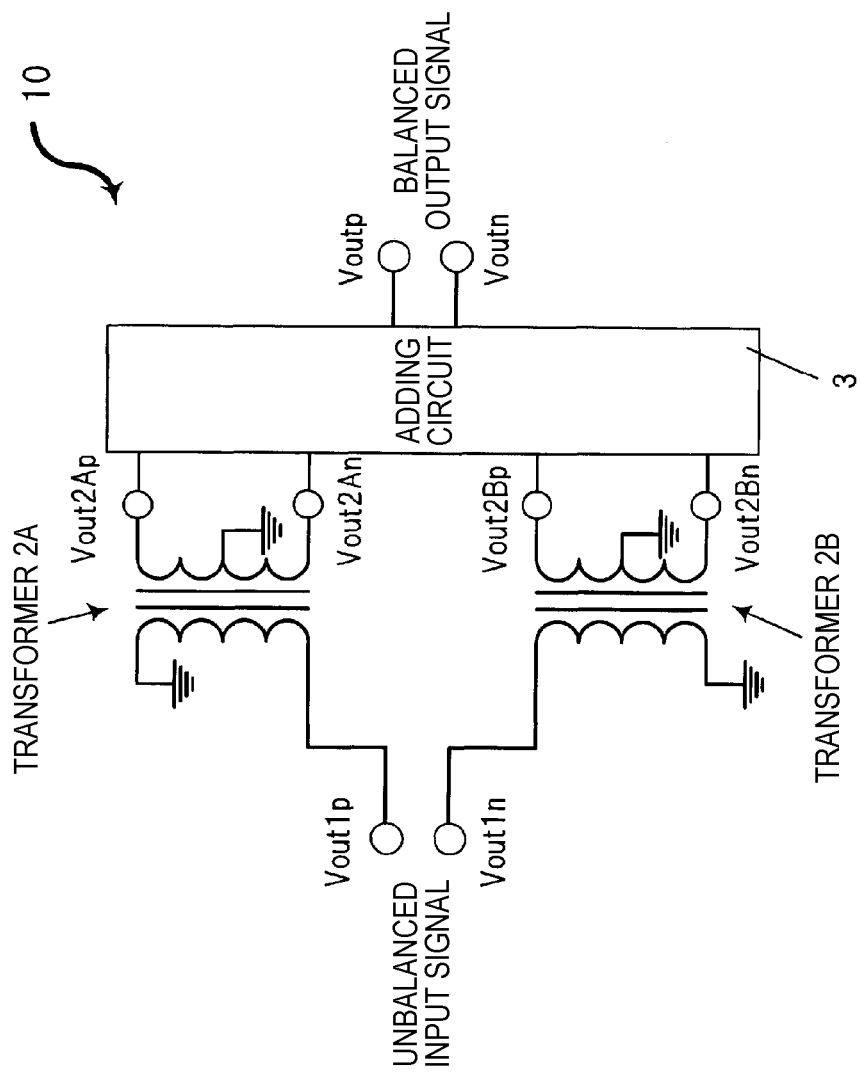
FIG. 1 is a circuit diagram showing the configuration of a power distribution circuit according to a first embodiment.

In a first embodiment, explanation will be made as to correction of phase error of the differential input signals. FIG. 1 is a circuit diagram showing the configuration of the power distribution circuit 10 in the first embodiment. The power distribution circuit 10 is configured to include transformers 2A, 2B to which a balanced input signal (differential input signals) is inputted and an adding circuit 3 which sums differential signals outputted from the transformers 2A, 2B to thereby output a balanced output signal (differential output signals). The transformers 2A, 2B are represented as an example of a first unbalance-to-balance transformer and a second unbalance-to-balance transformer, respectively, and each performs the unbalance-to-balance transformation (balun) on a positive phase signal or a negative phase signal of the inputted differential input signals to obtain a differential signal.

In this embodiment, in order to simplify the explanation, each of the transformers 2A, 2B is supposed to be an ideal transformer ($k=\alpha=1$, $\Delta\theta=0°$). Hereinafter, in each of the transformers 2A, 2B, a coupling coefficient is represented by a parameter $k$, gain error is represented by a parameter $\alpha$, and phase error is represented by a parameter $\Delta\theta$. A case where the transformers are not ideal ones will be explained later.

In this embodiment, phase of the positive phase signal of the differential input signal inputted into the transformer 2A is supposed to be $\theta1$, phase of the negative phase signal of the differential input signal inputted into the transformer 2B is supposed to be $\theta2-180°$ ($\theta1 \neq \theta2$), and the coupling coefficient is supposed to be $k$. Further, in this embodiment, it is supposed that phase error exists between the positive phase signal and the negative phase signal of the differential input signals inputted into the power distribution circuit 10 of FIG. 1.

Figure 2:
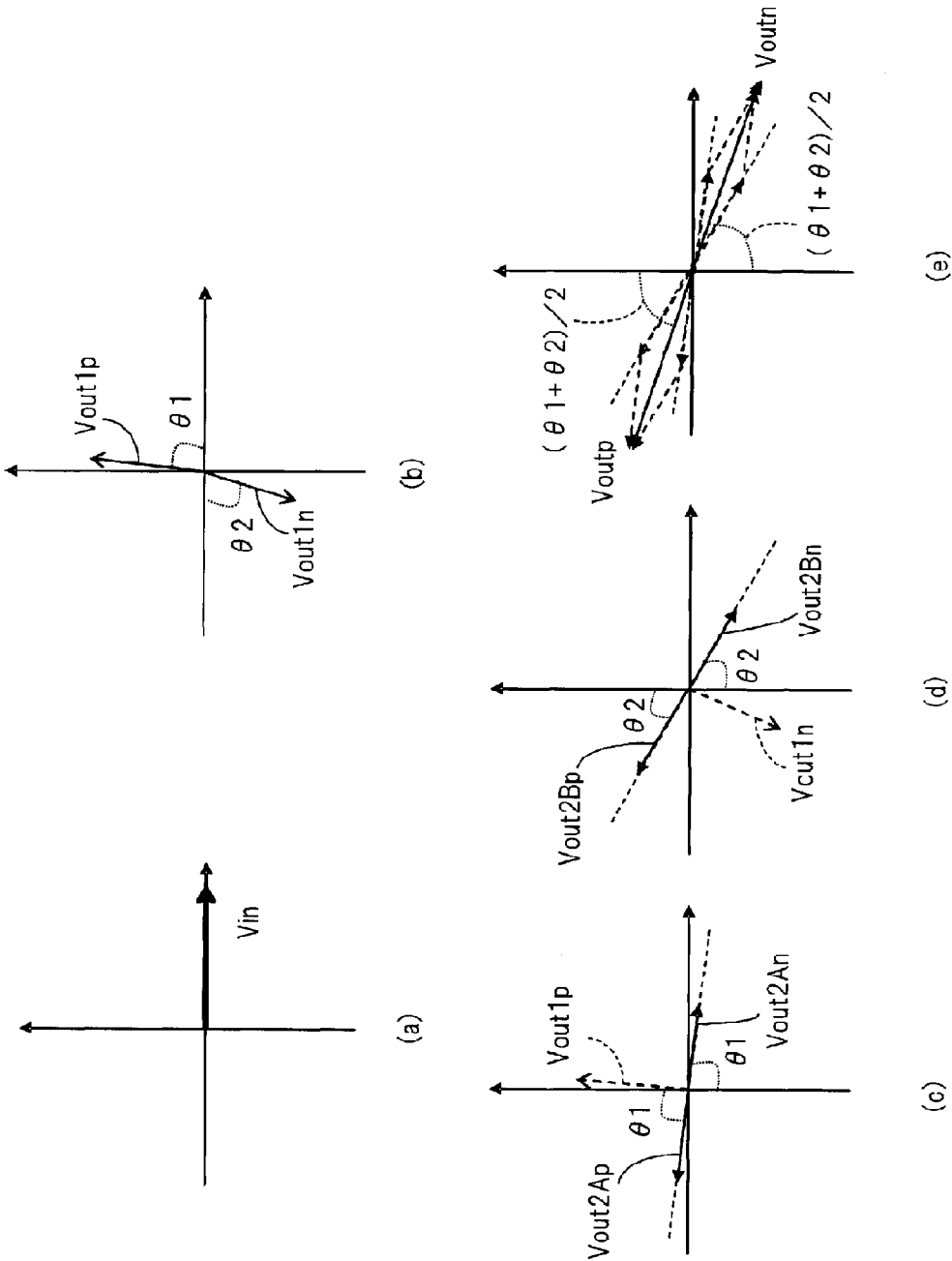
In FIG. 2, (a) is a diagram showing, on real and imaginary number coordinates, an unbalanced input signal inputted into ideal transformers, (b) is a diagram showing respective phases of the positive phase signal and the negative phase signal of differential input signals inputted into the ideal transformers, (c) is a diagram showing respective phases of a positive phase signal and a negative phase signal as output signals from one transformer, (d) is a diagram showing respective phases of a positive phase signal and a negative phase signal as output signals from the other transformer, and (e) is a diagram showing respective phases of a positive phase signal and a negative phase signal of differential output signals as output signals from an adding circuit.

FIG. 2(*a*) is a diagram showing, on real and imaginary number coordinates, the unbalanced input signal inputted into the ideal transformers (transformers 2A, 2B). FIG. 2(*b*) is a diagram showing respective phases of the positive phase signal and the negative phase signal of the differential input signals inputted into the ideal transformers (transformers 2A, 2B). FIG. 2(*c*) is a diagram showing respective phases of the positive phase signal and the negative phase signal as the output signals from the one transformer 2A. FIG. 2(*d*) is a diagram showing respective phases of the positive phase signal and the negative phase signal as the output signals from the other transformer 2B. FIG. 2(*e*) is a diagram showing respective phases of the positive phase signal and the negative phase signal of the differential output signals as the output signals from the adding circuit 3.

As shown in FIG. 2(*a*), when the unbalanced input signal (differential input signals Vin) is set as a vector on the real axis at the time of representing on the real and imaginary number coordinates, phase of the positive phase signal (Vout1*p*) of the differential input signals and phase of the negative phase signal (Vout1*n*) of the differential input signals are represented as θ1 and θ2−180°, respectively (see FIG. 2(*b*)).

Supposing that each of the transformers 2A and 2B is an ideal transformer, a phase shift amount between the input and output signals of the ideal transformer is represented as ±90°. In other words, the output signals (Vout2Ap, Vout2An) of the transformer 2A concerning the positive phase signal Vout1*p* of the differential input signals are outputted as the differential output signal of the positive phase signal (Vout2Ap) having phase θ1+90° and the negative phase signal (Vout2An) having phase θ1−90° (see FIG. 2(*c*)).

Similarly, the output signals (Vout2Bp, Vout2Bn) of the transformer 2B concerning the negative phase signal Vout1*n* of the differential input signals are outputted as the differential output signal of the positive phase signal (Vout2Bp) having phase θ2+90° and the negative phase signal (Vout2Bn) having phase θ2−90° (see FIG. 2(*d*)).

The adding circuit 3 composes a pair of differential output signals based on two pairs of the differential signals in total outputted from the transformers 2A and 2B in a manner of summing up vectors of the differential signals of the same phase components having the same vector direction. To be concrete, the adding circuit 3 sums up the positive phase signal (Vout2Ap) from the transformer 2A and the positive phase signal (Vout2Bp) from the transformer 2B to obtain the differential output signal (Voutp), and further sums up the negative phase signal (Vout2An) from the transformer 2A and the negative phase signal (Vout2Bn) from the transformer 2B to obtain the differential output signal (Voutn).

In this embodiment, since the amplitude error of each of the transformers 2A and 2B is set to be ideal (k=α=1), magnitudes of the vectors of the two pairs of the differential output signals in total outputted from the two transformers 2A and 2B are same. That is, phase of the positive phase signal (Voutp) outputted from the adding circuit 3 is (θ1+θ2)/2+90°. Phase of the negative phase signal (Voutn) outputted from the adding circuit 3 is (θ1+θ2)/2−90°.

Thus, in the power distribution circuit 10 according to this embodiment, phase error Δθ, which is error of opposing angles between the pair of differential output signals outputted from the adding circuit 3 becomes 0 (zero) according to a numerical expression (2).

[Expression 2]

$$\Delta\theta = (\theta 1 + \theta 2)/2 - (\theta 1 + \theta 2)/2 = 0 \qquad (2)$$

The power distribution circuit 10 according to this embodiment can obtain the pair of differential output signals outputted from the adding circuit 3 as the differential output signals in which the phase error (θ1−θ2) generated in the transformers 2A and 2B is corrected.

FIG. 3(*a*) is a diagram showing an example of the configuration of the adding circuit 3. As shown in FIG. 3(*a*), the adding circuit 3 sums up the differential input signals of the same phase components of the two pairs of differential input signals (first differential input signals and second differential input signals) as the output signals from the adding circuit 3 to thereby output the pair of differential output signals.

For example, as shown in FIG. 3(*a*), when the adding circuit 3 is configured by transmission lines 8, the adding circuit 3 combines (sums up) the differential input signals of the two same phase components (for example, positive phase signal Vout2Ap and positive phase signal Vout2Bp, or negative phase signal Vout2An and negative phase signal Vout2Bn) at the transmission lines 8 having the same length, respectively. Further, the adding circuit 3 can easily obtain the pair of differential output signals (for example, Voutp and Voutn) by extracting the pair of differential output signals having been combined (summed up) from the midpoints of the transmission lines 8, respectively.

The adding circuit 3 is configured by using the transmission lines 8 shown in FIG. 3(*a*). Thus, in a case of manufacturing by using wirings in device processes, the adding circuit 3 with high accuracy and less variations can be manufactured as compared with a case of using transistors, for example, as active elements.

Further, as shown in FIG. 3(*b*), when the adding circuit 3 is configured by using the transmission lines 8 in a manner that the differential output signals in diagonal direction (of different phase components) outputted from the transformers 2A and 2B are opposed, the adding circuit 3 can be easily realized by connecting the short transmission lines 8 of equal-length wirings between the two differential output signals. As a result, error between the differential output signals caused in the adding circuit 3 itself can be reduced. Accordingly, phase error of the differential output signals of the differential output signals (Voutp and Voutn) outputted from the adding circuit 3 can be reduced.

According to the power distribution circuit 10 of the first embodiment, the positive phase signal and the negative phase signal of the differential input signals are converted into the two pairs of differential output signals each having phase error by the unbalance-to-balance transformation (balun) of the transformers 2A and 2B, and the two pairs of differential output signals are composed into the pair of differential output signals in the adding circuit 3. Thus, the power distribution circuit 10 can average errors of the two pairs of differential signals outputted from the transformers 2A and 2B, for each of the positive phase signal and the negative phase signal, and can reduce circuit error (phase error) between the pair of differential output signals outputted from the adding circuit 3.

Accordingly, the power distribution circuit 10 can reduce error between the differential output signals with the simple circuit configuration, without causing such a phenomenon that circuit size and consumption current is increased due to the addition of the error detection circuit between the differential output signals and the error correction circuit for the variable gain and variable phase circuits. That is, the power distribution circuit 10 can reduce circuit error between the differential output signals without increasing circuit size and increasing consumption current and also without degrading radio efficiency, at the time of outputting the differential output signals.

Second Embodiment

Figure 4:
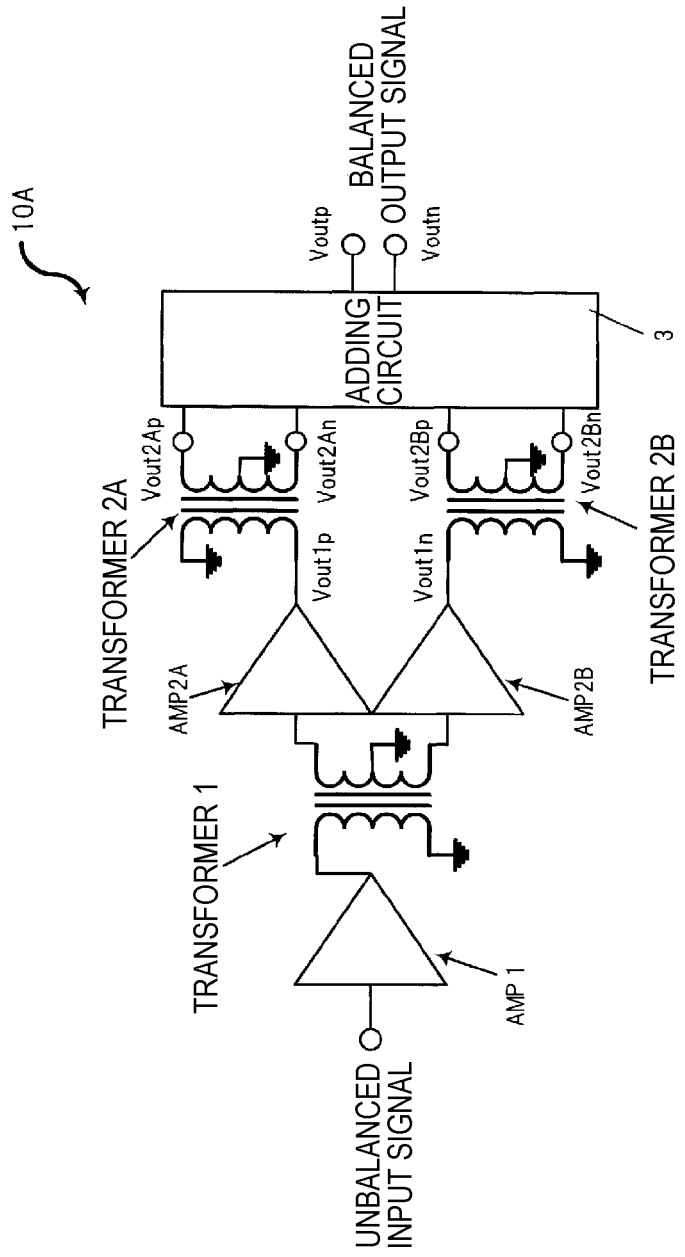
FIG. 4 is a circuit diagram showing the configuration of a power distribution circuit according to a second embodiment.

FIG. 4 is a circuit diagram showing the configuration of a power distribution circuit 10A according to a second embodiment. Constituent elements identical to those of the first embodiment are referred to by the common symbols, with explanation thereof being omitted.

The power distribution circuit 10A is configured, as compared with the power distribution circuit 10 of the first embodiment, to further include a circuit for amplifying differential signals, as a pair of differential input signals, which are obtained by performing the unbalance-to-balance transformation (balun) on an unbalanced input signal (single end signal) amplified by an amplifier AMP1 in a transformer 1.

That is, the power distribution circuit 10A is configured to include the amplifier AMP1, the transformer 1, amplifiers AMP2A, 2B, transformers 2A, 2B and an adding circuit 3. The amplifier AMP1 amplifiers the unbalanced input signal (single end signal) inputted into the power distribution circuit 10A. The amplifiers AMP2A, AMP2B are shown as examples of a first amplifier and a second amplifier, and amplify the positive phase signal and the negative phase signal of differential signals outputted from the transformer 1, respectively.

When an input signal is an unbalanced signal, the signals amplified by the respective amplifiers AMP1, AMP2A, 2B are amplified and outputted as an unbalanced signal.

The transformer 1, as a third unbalance-to-balance transformer, performs the unbalance-to-balance transformation (balun) on the unbalanced signal amplified by the amplifier AMP1 to thereby output differential signals. When the transformer 1 has the input/output characteristic as shown in the aforesaid numerical expression (1) (see FIG. 11), in the case of an ideal transformer, a gain error α between the differential signals as an output signal thereof becomes 1 time and a phase error Δθ thereof becomes θ1−θ2=0°. Thus, there arises no gain error nor phase error. However, in an actual transformer, since the wirings between the differential output signals are not arranged in a complete symmetrical manner, phase error is generated between the differential output signals.

The phase error (θ1−θ2) generated between the differential signals as the output signal of the transformer 1 becomes same as the phase error between the differential input signals explained in the first embodiment. Thus, like the first embodiment, the power distribution circuit 10A according to this embodiment can obtain, as differential output signals outputted from the adding circuit 3, a pair of differential output signals which is improved in phase error between the differential output signals.

Next, explanation will be made as to a case where error is generated between differential signals as output signals from the transformers 2A, 2B when the transformers 2A, 2B respectively acting as first and second unbalance-to-balance transformers are not ideal transformers.

First, phase error generated between the differential signals as the output signals from the transformers 2A, 2B will be explained with reference to FIG. 4.

Gain of each of the amplifiers AMP1, AMP2A, AMP2B is supposed to be 1 time, the transformer 1 is supposed to be an ideal transformer (k=α=1, Δθ=0°), and phase errors of the transformers 2A, 2B are supposed to be a same value on the assumption that each of the transformers 2A, 2B has the same configuration. In other words, the gain error α is represented by 1 time, a phase of the positive phase signal of the differential output signals from the transformer 2A is represented by parameter θ3, a phase of the negative phase signal of the differential output signals from the transformer 2A is represented by θ4−180° (θ3≠θ4), and a coupling coefficient k is represented by 1.

Figure 5:
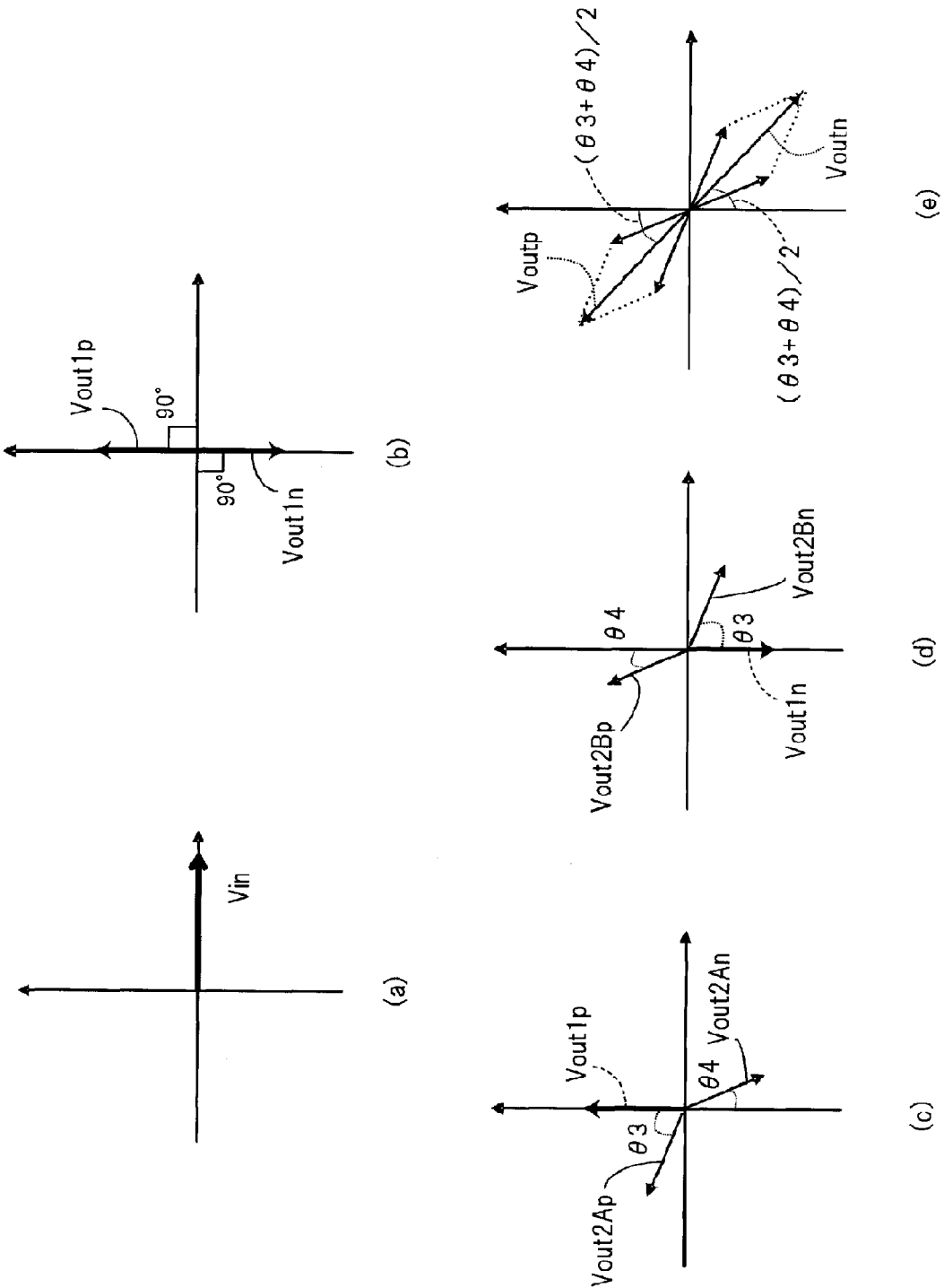
In FIG. 5, (a) is a diagram showing, on real and imaginary number coordinates, an unbalanced input signal inputted into an ideal transformer, (b) is a diagram showing respective phases of the positive phase signal and the negative phase signal of differential signals outputted from the ideal transformer, (c) is a diagram showing respective phases of a positive phase signal and a negative phase signal as output signals from one transformer, (d) is a diagram showing respective phases of a positive phase signal and a negative phase signal as output signals from the other transformer, and (e) is a diagram showing respective phases of the positive phase signal and the negative phase signal of differential output signals as output signals from an adding circuit.

FIG. 5(a) is a diagram showing, on real and imaginary number coordinates, the unbalanced input signal inputted into the ideal transformer (transformer 1). FIG. 5(b) is a diagram showing respective phases of the positive phase signal and the negative phase signal of the differential signals outputted from the ideal transformer (transformer 1). FIG. 5(c) is a diagram showing respective phases of the positive phase signal and the negative phase signal as the output signals from the one transformer 2A. FIG. 5(d) is a diagram showing respective phases of the positive phase signal and the negative phase signal as the output signals from the other transformer 2B. FIG. 5(e) is a diagram showing respective phases of the positive phase signal and the negative phase signal of the differential output signals as the output signals from the adding circuit 3.

As shown in FIG. 5(a), when the unbalanced input signal (single end signal Vin) inputted into the transformer 1 is set as a vector on the real axis at the time of representing on the real and imaginary number coordinates, a phase of the positive phase signal (Vout1p) of the differential signals outputted from the transformer 1 is represented by +90° (see FIG. 5(b)). Further, a phase of the negative phase signal (Vout1n) of the differential signals outputted from the transformer 1 is represented by −90° (see FIG. 5(b)).

The transformer 2A receives an input of the positive phase signal (Vout1p) of the differential signals outputted from the transformer 1 and performs the unbalance-to-balance transformation (balun) to thereby output a positive phase signal (Vout2Ap) and a negative phase signal (Vout2An) (see FIG. 5(c)). As shown in FIG. 5(c), the positive phase signal (Vout2Ap) from the transformer 2A is outputted with a phase (θ3+90° and the negative phase signal (Vout2An) from the transformer 2A is outputted with a phase (θ4−90°).

The transformer 2B receives an input of the negative phase signal (Vout1n) of the differential signals outputted from the transformer 1 and performs the unbalance-to-balance transformation (balun) to thereby output a positive phase signal (Vout2Bp) and a negative phase signal (Vout2Bn) (see FIG. 5(d)). As shown in FIG. 5(d), the positive phase signal (Vout2Bp) from the transformer 2B is outputted with a phase (θ3−90°) and the negative phase signal (Vout2Bn) from the transformer 2B is outputted with a phase (θ4+90°).

The adding circuit 3 composes a pair of differential output signals based on two pairs of the differential signals in total outputted from the transformers 2A and 2B in a manner of summing up vectors of the differential signals of the same phase components having the same vector direction. To be concrete, the adding circuit 3 sums up the positive phase signal (Vout2Ap) from the transformer 2A and the positive phase signal (Vout2Bp) from the transformer 2B to obtain the differential output signal (Voutp), and further sums up the negative phase signal (Vout2An) from the transformer 2A and the negative phase signal (Vout2Bn) from the transformer 2B to obtain the differential output signal (Voutn).

At the time of composing into the pair of differential output signals, since amplitude error of each of the transformers 2A and 2B is set to be ideal (k=α=1), sizes of vectors of the two pairs of differential signals outputted from the two transformers 2A and 2B become the same.

That is, a phase of the positive phase signal (Voutp) of the pair of differential output signals outputted from the adding circuit 3 becomes (θ3+θ4)/2+90° and a phase of the negative phase signal (Voutn) thereof becomes (θ3+θ4)/2−90°. Thus, in the power distribution circuit 10A according to this embodiment, a phase error Δθ, which is error of opposing angles between the pair of differential output signals outputted from the adding circuit 3, becomes 0 (zero) according to a numerical expression (3).

[Expression 3]

$$\Delta\theta=(\theta3+\theta4)/2-(\theta3+\theta4)/2=0 \quad (3)$$

The power distribution circuit 10A according to this embodiment can obtain the pair of differential output signals outputted from the adding circuit 3 as differential output signals in which the phase error (θ3−θ4) generated in the transformers 2A and 2B is corrected.

Next, explanation will be made as to a case where error is generated between the differential signals as the output signals from the transformers 1, 2A, 2B when each of the transformers 1, 2A, 2B is not an ideal transformer.

Phase error generated between the differential signals as the output signals from the transformers 1, 2A, 2B will be explained with reference to FIG. 4.

Gain of each of the amplifiers AMP1, AMP2A, AMP2B is supposed to be 1 time, and phase errors of the transformers 2A, 2B are supposed to be a same value on the assumption that each of the transformers 2A, 2B has the same configuration. In other words, the gain error α is represented by 1 time, a phase of the positive phase signal of the differential output signals from the transformer 1 is represented by a parameter θ1, a phase of the negative phase signal of the differential output signals from the transformer 1 is represented by θ2−180° (θ1≠θ2), a phase of the positive phase signal of the differential output signals from the transformer 2A is represented by a parameter θ3, a phase of the negative phase signal of the differential output signals from the transformer 2A is represented by θ4−180° (θ3≠θ4), and a coupling coefficient k is represented by 1.

Figure 6:
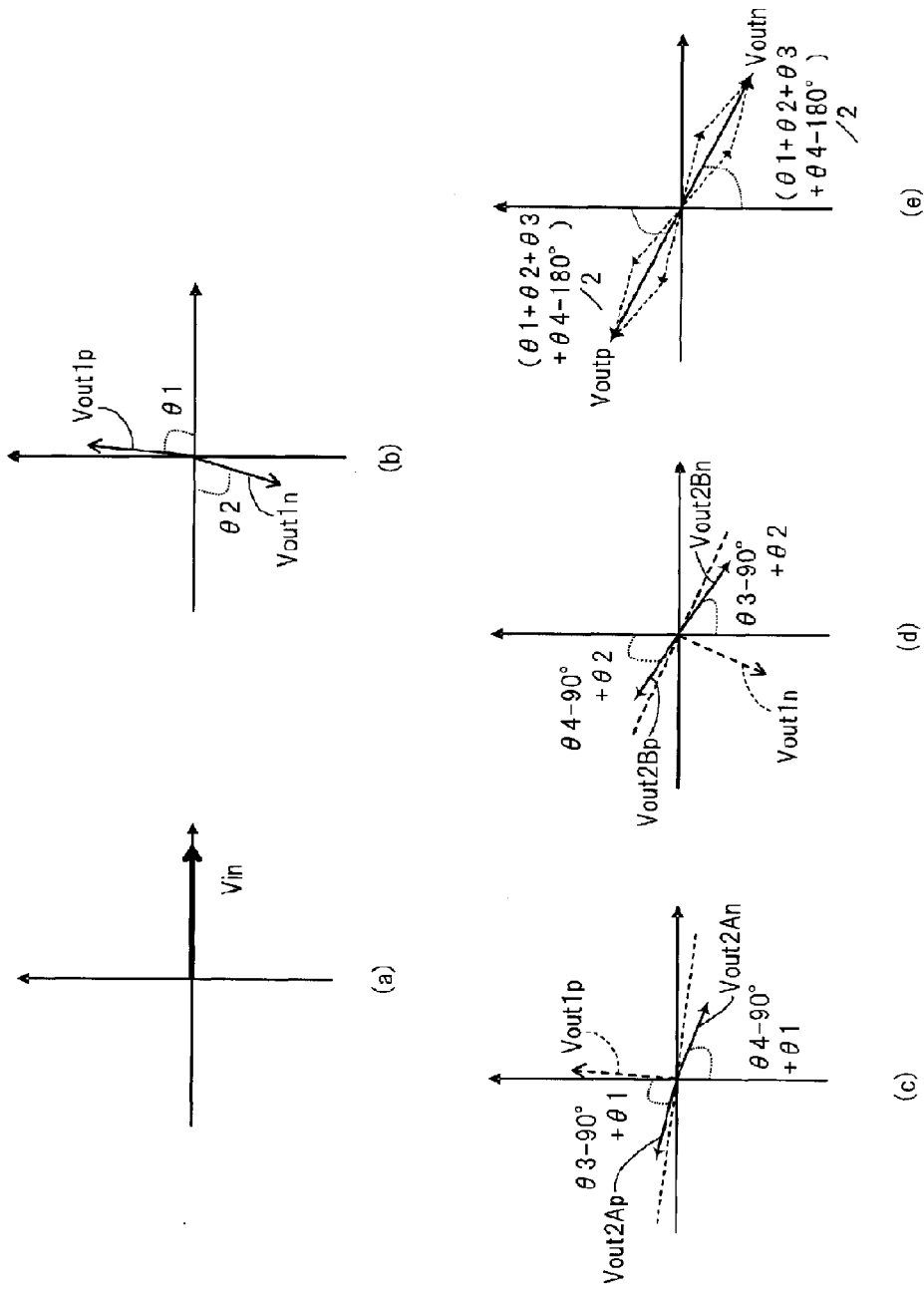
In FIG. 6, (a) is a diagram showing, on real and imaginary number coordinates, an unbalanced input signal inputted into a transformer as a non-ideal transformer, (b) is a diagram showing respective phases of the positive phase signal and the negative phase signal of differential signals outputted from the transformer as the non-ideal transformer, (c) is a diagram showing respective phases of a positive phase signal and a negative phase signal as output signals from one transformer as a non-ideal transformer, (d) is a diagram showing respective phases of a positive phase signal and a negative phase signal as output signals from the other transformer as a non-ideal transformer, and (e) is a diagram showing respective phases of the positive phase signal and the negative phase signal of differential output signals as output signals from an adding circuit

FIG. 6(a) is a diagram showing, on real and imaginary number coordinates, the unbalanced input signal inputted into the transformer 1 as a non-ideal transformer. FIG. 6(b) is a diagram showing respective phases of the positive phase signal and the negative phase signal of the differential signals outputted from the transformer 1 as the non-ideal transformer. FIG. 6(c) is a diagram showing respective phases of the positive phase signal and the negative phase signal as the output signals from the one transformer 2A as a non-ideal transformer. FIG. 6(d) is a diagram showing respective phases of the positive phase signal and the negative phase signal as the output signals from the other transformer 2B as a non-ideal transformer. FIG. 6(e) is a diagram showing respective phases of the positive phase signal and the negative phase signal of the differential output signals as the output signals from the adding circuit 3.

As shown in FIG. 6(a), when the unbalanced input signal (single end signal Vin) inputted into the transformer 1 is set as a vector on the real axis at the time of representing on the real and imaginary number coordinates, a phase of the positive phase signal (Vout1p) of the differential signals outputted from the transformer 1 is represented not by +90° but by θ1 (see FIGS. 2(b) and 5(b)). Further, a phase of the negative phase signal (Vout1n) of the differential signals outputted from the transformer 1 is represented not by −90° but by −θ2 (see FIGS. 2(b) and 5(b)).

The transformer 2A receives an input of the positive phase signal (Vout1p) of the differential signals outputted from the transformer 1 and performs the unbalance-to-balance transformation (balun) to thereby output a positive phase signal (Vout2Ap) and a negative phase signal (Vout2An) (see FIG. 6(c)). As shown in FIG. 6(c), the positive phase signal (Vout2Ap) from the transformer 2A is outputted with a phase (θ3−90°+θ1) by rotating the positive phase signal (Vout2Ap) shown in FIG. 5(c) toward the direction reducing the phase thereof by (90°−θ1). Further, the negative phase signal (Vout2An) from the transformer 2A is outputted with a phase (θ4−90°+θ1) by rotating the negative phase signal (Vout2An) shown in FIG. 5(c) toward the direction reducing the phase thereof by (90°−θ1).

The transformer 2B receives an input of the negative phase signal (Vout1n) of the differential signals outputted from the transformer 1 and performs the unbalance-to-balance transformation (balun) to thereby output a positive phase signal (Vout2Bp) and a negative phase signal (Vout2Bn) (see FIG. 6(d)). As shown in FIG. 6(d), the positive phase signal (Vout2Bp) from the transformer 2B is outputted with a phase (θ3−90°+θ2) by rotating the positive phase signal (Vout2Bp) shown in FIG. 5(d) toward the direction reducing the phase thereof by (90°−θ2). Further, the negative phase signal (Vout2Bn) from the transformer 2B is outputted with a phase (θ4−90°+θ2) by rotating the negative phase signal (Vout2Bn) shown in FIG. 5(d) toward the direction reducing the phase thereof by (90°−θ2).

The adding circuit 3 composes a pair of differential output signals based on two pairs of the differential signals in total outputted from the transformers 2A and 2B in a manner of summing up vectors of the differential signals of the same phase components having the same vector direction. To be concrete, the adding circuit 3 sums up the positive phase signal (Vout2Ap) from the transformer 2A and the positive phase signal (Vout2Bp) from the transformer 2B to obtain the differential output signal (Voutp), and further sums up the negative phase signal (Vout2An) from the transformer 2B and the negative phase signal (Vout2Bn) from the transformer 2B to obtain the differential output signal (Voutn).

At the time of composing into the pair of differential output signals, since amplitude error of each of the transformers 2A and 2B is set to be ideal (k=α=1), sizes of vectors of the two pairs of differential signals outputted from the two transformers 2A and 2B become the same.

That is, a phase of the positive phase signal (Voutp) of the pair of differential output signals outputted from the adding circuit 3 becomes (θ1+θ2+θ3+θ4−180°)/2 and a phase of the negative phase signal (Voutn) thereof also becomes (θ1+θ2+θ3+θ4−180°)/2. Thus, in the power distribution circuit 10A according to this embodiment, a phase error Δθ, which is error of opposing angles between a pair of the differential output signals outputted from the adding circuit 3, becomes 0 (zero) according to a numerical expression (4).

[Expression 4]

$$\Delta\theta = (\theta_1+\theta_2+\theta_3+\theta_4-180°)/2 - (\theta_1+\theta_2+\theta_3+\theta_4-180°)/2 = 0 \quad (4)$$

The power distribution circuit 10A according to this embodiment can obtain the pair of differential output signals outputted from the adding circuit 3 as differential output signals in which the phase errors {(θ1−θ2), (θ3−θ4)} generated in the transformers 2A and 2B is corrected.

Next, phase error generated between the differential signals as the output signals from the transformers 2A, 2B will be explained with reference to FIG. 4. In order to explain amplitude errors of the transformers 2A and 2B, the coupling coefficient of each of the transformers 2A, 2B is supposed to be 1 and the phase error Δθ thereof is supposed to be ideally 0° (zero degree).

An amplitude of the positive phase signal (Vout1p) of the differential signals as the output signals from the transformer 1 is Vin/2, and amplitude of the negative phase signal (Vout1n) of the differential signals as the output signals from the transformer 1 is (Vin/2)*α.

An amplitude of the positive phase signal (Vout2Ap) of the differential signals as the output signals from the transformer 2A is (Vin/4)*α, and an amplitude of the negative phase signal (Vout2An) of the differential signals as the output signals from the transformer 2A is Vin/4. The transformer 2A is applied with the positive phase signal (Vout1p) of the differential signals as the output signals from the transformer 1.

Further, an amplitude of the positive phase signal (Vout2Bp) of the differential signals as the output signals from the transformer 2B is (Vin/4)*α, and an amplitude of the negative phase signal (Vout2Bn) of the differential signals as the output signals from the transformer 2B is (Vin/4)*α2. The transformer 2B is applied with the negative phase signal (Vout1n) of the differential signals as the output signals from the transformer 1.

An amplitude of the positive phase signal (Voutp) of the differential output signals as the output signals from the adding circuit 3 is (Vin/4)*2α according to the addition of the amplitude of the positive phase signal (Vout2Ap) of the differential signals from the transformer 2A and the amplitude of the positive phase signal (Vout2Bp) of the differential signals from the transformer 2B. Further, an amplitude of the negative phase signal (Voutn) of the differential output signals as the output signals from the adding circuit 3 is Vin/4*(1+α2) according to the addition of the amplitude of the negative phase signal (Vout2An) of the differential signals from the transformer 2A and the amplitude of the negative phase signal (Vout2Bn) of the differential signals from the transformer 2B. The positive phase signal and the negative phase signal of the differential output signals outputted from the adding circuit 3 are called a pair of the differential output signals.

In the case of performing the unbalance-to-balance transformation (balun) using a single transformer as shown in FIG. 10, like the output of the transformer 1, an amplitude error (supposing ΔV) between the positive phase signal and the negative phase signal in the differential output signals from the adding circuit 3 becomes ΔV=Vin*(1−α)/2. On the other hand, like this embodiment, in the configuration of the power distribution circuit 10A of FIG. 4, an amplitude error ΔV between the positive phase signal and the negative phase signal in the differential output signals becomes ΔV=Vin*((1−α)/2)2.

Thus, in the pair of differential output signals outputted from the adding circuit 3 in the power distribution circuit 10A of FIG. 4, error between the differential output signals can be improved with accuracy of square (accuracy inversely proportional to square of variation amounts), as compared with the case of performing the unbalance-to-balance transformation (balun) using a single transformer as shown in FIG. 10.

For example, in the case of α=0.9, the amplitude error ΔV between the differential output signals of a single transformer becomes ΔV=1/20. In contrast, in the unbalance-to-balance transformation (balun) in the configuration of the power distribution circuit 10A of FIG. 4, since the amplitude error ΔV between the differential output signals becomes ΔV=1/400, the output signals corrected in the amplitude error ΔV can be obtained.

According to the power distribution circuit 10A of the second embodiment, the two pairs of differential signals having amplitude error and phase error between the differential signals generated in the first and second unbalance-to-balance transformers (transformers 2A, 2B) are summed up (composed) into the pair of differential output signals by the adding circuit 3.

Thus, the power distribution circuit 10A can average errors of the two pairs of differential signals outputted from the first and second unbalance-to-balance transformers (transformers 2A, 2B), for each of the positive phase signal and the negative phase signal, and can reduce circuit errors (phase error Δθ and amplitude error ΔV) between the pair of differential output signals outputted from the adding circuit 3. In particular, as to the amplitude error ΔV, since the unbalance-to-balance transformation (balun) is performed in the first and second unbalance-to-balance transformers (transformers 2A, 2B), error between the pair of differential output signals can be improved with accuracy of square as compared with the case of performing the unbalance-to-balance transformation (balun) using a single unbalance-to-balance transformer (transformer) as shown in FIG. 10.

Thus, the power distribution circuit 10A can reduce error between the differential output signals with the simple circuit configuration, without causing such a phenomenon that circuit size and consumption current is increased due to the addition of the error detection circuit between the differential output signals and the error correction circuit for the variable gain and variable phase circuits.

Figure 7:
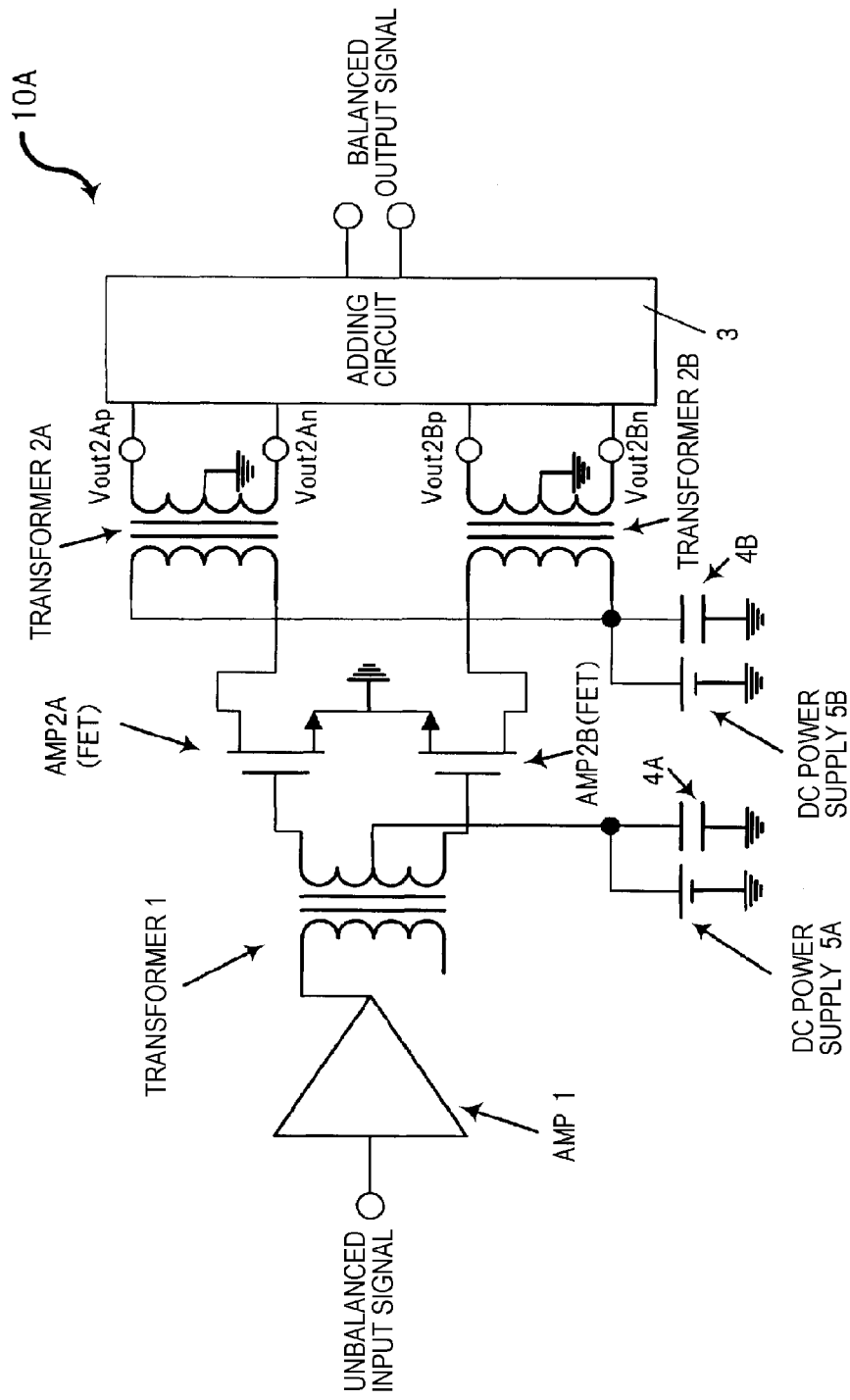
FIG. 7 is a circuit diagram showing the configuration of a power distribution circuit in a case of connecting capacitors and DC power supplies.

In each of the transformers 1, 2A, 2B for performing the unbalance-to-balance transformation (balun), each of the input terminal having no input and a midpoint between the output terminals for the positive phase signal and the negative phase signal of the differential signals is connected to the ground (GND). Further, at the input terminal and the midpoint, capacitors may be connected each of which is considered to be connected to the GND in an AC mode at the frequency of the input signal. FIG. 7 is a circuit diagram showing the configuration of the power distribution circuit 10A in a case of connecting capacitors and DC power supplies.

In the power distribution circuit 10A of FIG. 7, a capacitor 4A is disposed between the aforesaid midpoint and a grounding point, and a capacitor 4B is disposed between the aforesaid input points and the grounding point. Each of the amplifiers AMP2A and AMP2B is configured by using an FET (field effect transistor). DC power supplies (constant voltage power supplys) 5A, 5B are respectively connected in parallel to the capacitors 4A, 4B which are considered to be connected to the GND in an AC (alternating current) mode. Each of the DC power supplies can supply DC voltage as power source.

The DC power supply 5A supplies bias voltage, and the DC power supply 5B supplies power supply voltage. The bias voltage and the power supply voltage are directly supplied to the FET acting as a transistor in order to utilize the transformer as a load for supplying DC.

Thus, in the FET acting as a transistor, a circuit for supplying the bias voltage and the power supply voltage can be eliminated, and hence an area of the circuit can be further reduced. In other words, a load circuit, required for supplying the bias voltage and the power supply voltage necessary in the amplifier, can be eliminated, and hence the circuit can be simplified and an area of the circuit can be reduced.

Third Embodiment

Figure 8:
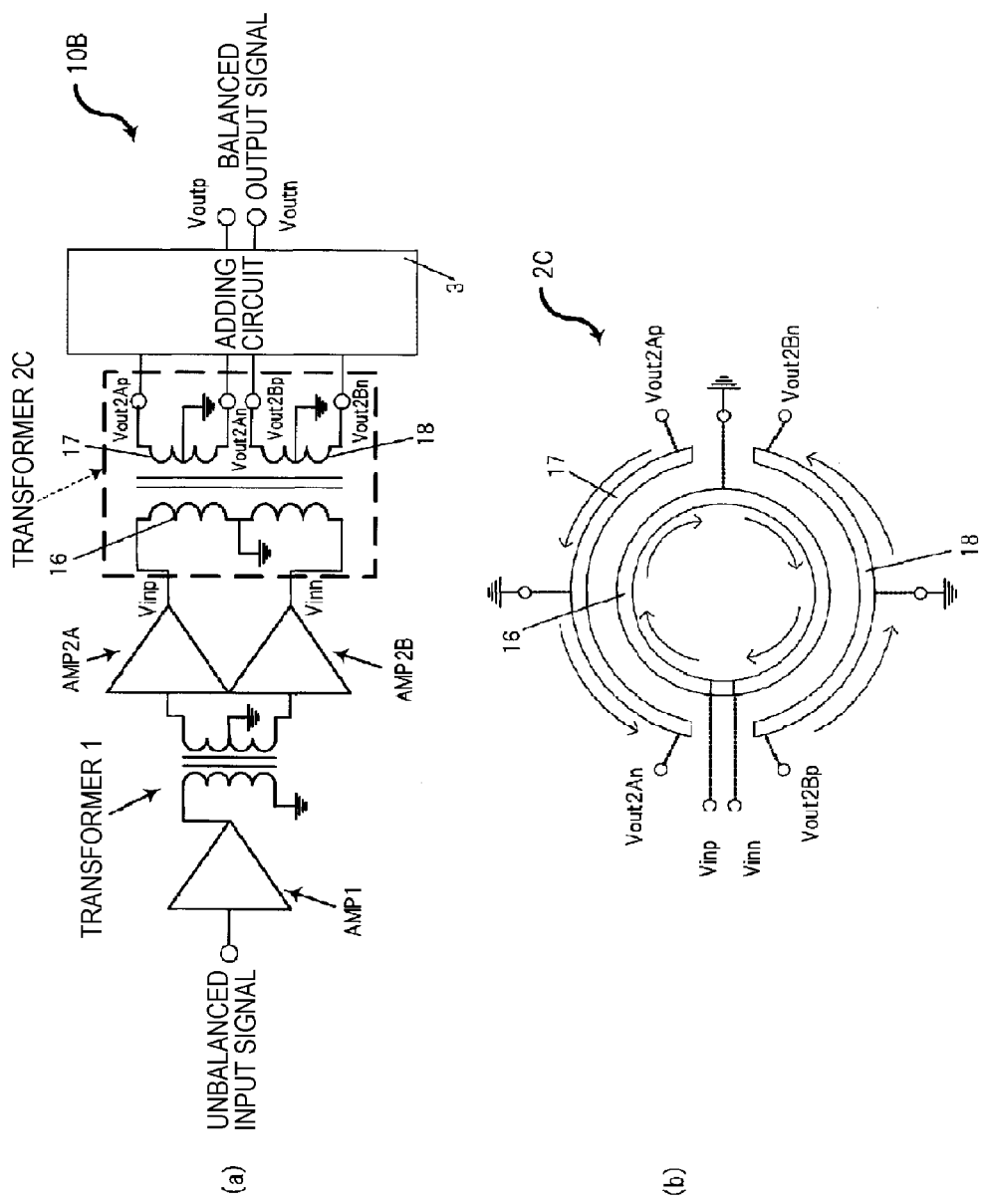
In FIG. 8, (a) is a circuit diagram showing the configuration of a power distribution circuit according to a third embodiment, and (b) is a diagram showing an example of the configuration of a transformer.

FIG. 8(*a*) is a circuit diagram showing the configuration of a power distribution circuit 10B according to a third embodiment. Constituent elements identical to those of the second embodiment are referred to by the common symbols, with explanation thereof being omitted.

As shown in FIG. 8(*a*), the power distribution circuit 10B according to the third embodiment is configured to be provided with a transformer 2C in place of the transformers 2A and 2B, as compared with the second embodiment. To be concrete, the power distribution circuit 10B is configured to include an amplifier AMP1, a transformer 1, amplifiers AMP2A, 2B, a transformer 2C and an adding circuit 3. The transformer 2C is shown as an example of a fourth unbalance-to-balance transformer. The transformer 2C receives, as a pair of differential signals, inputs of a positive phase signal as the output signal of the amplifier AMP2A and a negative phase signal as the output signal of the amplifier AMP2B, and performs the unbalance-to-balance transformation (balun) on the positive phase signal and the negative phase signal thus inputted to thereby output a pair of differential output signals.

In the first embodiment, the positive phase signal and the negative phase signal of the differential input signals are inputted into the transformers 2A and 2B, respectively. When there arises gain error or phase error between the positive phase signal and the negative phase signal of the differential input signals, the transformers 2A and 2B convert the positive and negative phase signals into the differential signals without correcting the error at the input terminals of each of the transformers 2A and 2B.

In the transformer 2C of the third embodiment, the pair of differential input signals inputted into the transformer 2C are subjected to change according to respective characteristics of the same gain and phase from the respective input terminals in the transformer 2C, and combined (summed up) at a GND grounding point that is coupled in an AC (alternative current) mode as a midpoint.

Thus, errors contained at the input terminals of the transformer 2C of the differential input signals inputted into the transformer 2C are corrected and reduced so as to be a GND voltage at the GND grounding point that is coupled in an AC mode as the midpoint. Further, since the differential input signals are converted into the pair of differential output signals according to the combining between the input and output signals in the transformer 2C, error can be further reduced at the differential output signal terminals of the transformer 2C.

As compared with the second embodiment, the power distribution circuit 10B according to the third embodiment can obtain the differential output signals reduced in respective errors in gain or phase while reducing the circuit area of the transformer. That is, according to the power distribution circuit 10B of the third embodiment, since the number of the unbalance-to-balance transformer (transformer 2C) to be connected to the output of the amplifier can be made single, error between the differential output signals due to variance of efficiency of the unbalance-to-balance transformers can be reduced while reducing the area of the circuit.

Further, as shown in FIG. 8(*b*), the transformer 2C is configured by using transmission lines. FIG. 8(*b*) is a diagram showing an example of the configuration of the transformer 2C. That is, in the transformer 2C, a midpoint of the pair of differential input signals (Vinp, Vinn) are grounded (GND) in a transmission line 16, whilst the two pairs of differential output signals are coupled in transmission lines 17, 18, respectively. The transmission line 16 corresponds to a single input transmission line, and the transmission lines 17, 18 correspond to two output transmission lines.

In the configuration of the transformer 2C in FIG. 8(*b*), almost half of the length of the transmission line to the GND grounding point from each of the input terminals of the pair of differential input signals equals to the length of the transmission line to the GND grounding point from each of the output terminals of the two pairs of differential output signals.

The differential output signals are generated by electromagnetic induction in a manner that an amount of current flowing into the GND grounding point as a center point is balanced with an amount of current flowing out therefrom, as represented by arrows in FIG. 8(*b*). Thus, the transformer 2C can obtain the two pairs of differential output signals having same gain and phase characteristics.

The transformer 2C is configured by using the transmission lines. Thus, in a case of manufacturing by using wirings in device processes, the transformer for generating the two pairs of differential output signals with high accuracy and less variations can be manufactured as compared with a case of using transistors, for example, as active elements.

For example, the transformer can be formed by combining three transmission lines with less variations using silicon processes. Thus, error between the differential outputs due to variations of efficiencies of the unbalance-to-balance transformers can be reduced and also the area of the circuit can be reduced.

In FIG. 8(*b*), almost half of the length of the transmission line to the GND grounding point from each of the input terminals of the pair of differential input signals equals to the length of the transmission line to the GND grounding point from each of the output terminals of the two pairs of differential output signals. Further, by adjusting the lengths of the respective transmission lines, matching of circuits to which respective input and output signals are coupled can be optimized and so a matching circuit for impedance can be eliminated.

Fourth Embodiment

Figure 9:
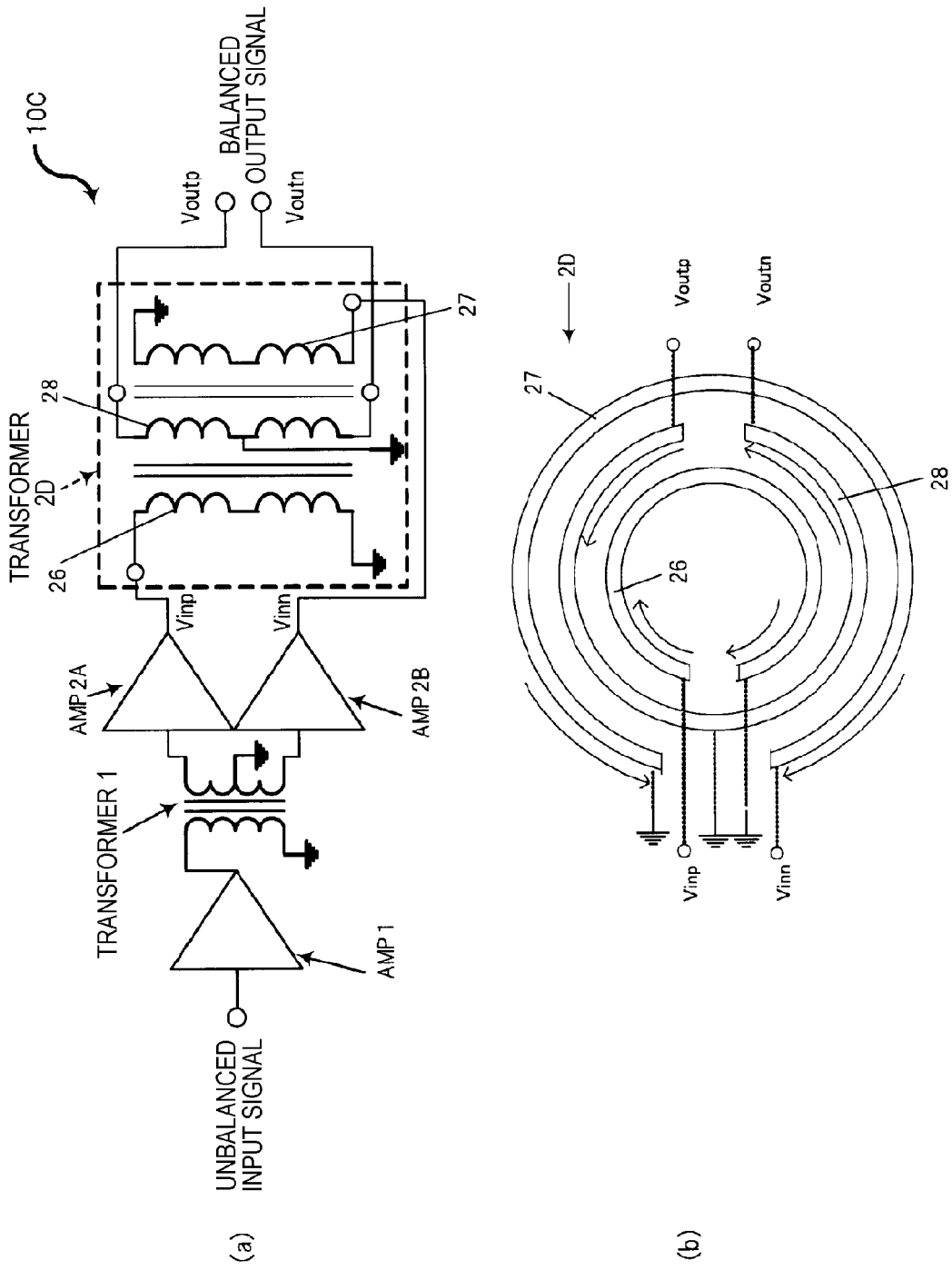
In FIG. 9, (a) is a circuit diagram showing the configuration of a power distribution circuit according to a fourth embodiment, and (b) is a diagram showing an example of the configuration of a transformer.

FIG. 9(*a*) is a circuit diagram showing the configuration of a power distribution circuit 10C according to a fourth embodiment. Constituent elements identical to those of the second embodiment are referred to by the common symbols, with explanation thereof being omitted.

As shown in FIG. 9(*a*), the power distribution circuit 10C according to the fourth embodiment is configured to be provided with a transformer 2D in place of the transformers 2A, 2B and the adding circuit 3, as compared with the second embodiment. To be concrete, the power distribution circuit 10C is configured to include an amplifier AMP1, a transformer 1, amplifiers AMP2A, 2B and a transformer 2D. The transformer 2D is shown as an example of a fifth unbalance-to-balance transformer. The transformer 2D receives, as a pair of differential signals, inputs of a positive phase signal as the output signal of the amplifier AMP2A and a negative phase signal as the output signal of the amplifier AMP2B, and performs the unbalance-to-balance transformation (balun) on the positive phase signal and the negative phase signal thus inputted to thereby output a pair of differential output signals.

In the first embodiment, the positive phase signal and the negative phase signal of the differential input signals are inputted into the transformers 2A and 2B, respectively. When there arises gain error or phase error between the positive phase signal and the negative phase signal of the differential input signals, the transformers 2A and 2B convert the positive and negative phase signals into the differential signals without correcting the error at the input terminals of each of the transformers 2A and 2B. Further, the adding circuit 3 is required in order to reduce error between the differential output signals of the transformers 2A and 2B.

In the transformer 2D according to the fourth embodiment, the positive phase signal of the inputted differential signals is combined (summed up) with the positive phase signal and the negative phase signal of the differential output signals and outputted. Further, also the negative phase signal of the inputted differential signals is combined (summed up) with the positive phase signal and the negative phase signal of the differential output signals and outputted. That is, the transformer 2D is a transformer circuit for combining the input signals and the output signals, and has the function of the adding circuit 3 in the aforesaid respective embodiments.

According to the power distribution circuit 10C of the fourth embodiment, error between the differential output signals generated in the transformer 2D can be reduced while reducing the area of the circuit without adding the adding circuit 3 in the aforesaid respective embodiments. In other words, since the unbalance-to-balance transformer connected to the amplifiers and the adding circuit can be configured by using a single unbalance-to-balance transformer (transformer 2D), error between the differential outputs due to variations of efficiencies of the unbalance-to-balance transformers can be reduced and the area of the circuit can be reduced.

Further, the positive phase signal and the negative phase signal of the differential input signals of the transformer 2D are combined via the differential output signals, and are subjected to change according to respective characteristics of the same gain and phase from the respective input terminals and then connected to the GND (ground). Thus, a midpoint of the differential input signals is regarded to be combined at the GND grounding point in an AC mode.

In other words, error of the differential input signals contained at the input terminals of the transformer 2D is reduced at the GND grounding point before the transformer 2D combines the differential output signals according to the electromagnetic induction within the transformer 2D. Thus, influence of error on the differential output signals after the input signal-to-output signal conversion can be improved. As a result, according to the power distribution circuit 10C according to this embodiment, the area of the circuit can be reduced while reducing gain and phase errors.

Further, as shown in FIG. 9(b), the transformer 2D is configured by using transmission lines. FIG. 9(b) is a diagram showing an example of the configuration of the transformer 2D. That is, in the transformer 2D, the positive phase signal and the negative phase signal (Vinp, Vinn) of the pair of differential input signals are connected to the GND (grounded) in an AC mode via loads of transmission lines 26, 27, respectively.

In the configuration of the transformer 2D in FIG. 9(b), almost half of the length of the transmission line to the GND grounding point from each of the input terminals equals to the length of the transmission line to the GND grounding point from the output terminals of the positive phase signal and the negative phase signal of the pair of differential output signals.

Further, the two transmission lines 26, 27 of the differential input signals and the transmission line 28 of the differential output signals are disposed in a manner that currents flowing in opposite directions are combined. Thus, the pair of differential output signals are generated by electromagnetic induction in a manner that an amount of current flowing into the GND grounding point as a center is balanced with an amount of current flowing out therefrom, as represented by arrows in FIG. 9(b).

Thus, the transformer 2D can obtain the pair of differential output signals having same gain and phase characteristics. Incidentally, the transmission lines 26, 27 correspond two input transmission lines, and the transmission line 28 corresponds to a single output transmission line.

The transformer 2D is configured by using the transmission lines. Thus, in a case of manufacturing by using wirings in device processes, a pair of the differential output signals can be generated with high accuracy and less variations as compared with a case of using transistors, for example, as active elements. Further, the function of the adding circuit can be provided.

For example, the transformer can be formed by combining the three transmission lines with less variations using silicon processes. Thus, error between differential outputs due to variations of efficiencies of the unbalance-to-balance transformers can be reduced and also the area of the circuit can be reduced.

As described above, although the various kinds of embodiments are explained with reference to the drawings, it goes without saying that the present invention is not limited thereto. It will be apparent for those skilled in the art to think of changed examples and modified examples of the various kinds of embodiments and further combination examples of the various kinds of embodiments, within a range of claims. Of course, such examples are considered to also belong to technical range of the present invention.

For example, the second embodiment shows the case that, in the transformers 1, 2A, 2B, each of the input terminal having no input and the midpoint between the output terminals for the positive phase signal and the negative phase signal of the differential output signals is connected to the capacitor which is considered to be connected to the GND in an AC mode at the frequency of the input signal. This is applicable to each of the first, third and fourth embodiments in the similar manner.

Further, a bipolar transistor may be employed in place of the FET as the amplifier.

The present application is based on Japanese Patent Application No. 2011-164742 filed on Jul. 27, 2011, the contents of which are incorporated herein by reference.

INDUSTRIAL APPLICABILITY

The present invention is usable as the power distribution circuit which, in the case of outputting a pair of the differential output signals from the differential input signals, can reduce circuit error between the differential output signals without increasing circuit size and consumption current and also without degrading radio efficiency.

REFERENCE SIGNS LIST 1, 2A, 2B, 2C, 2D: transformer
3: adding circuit
4A, 4B: capacitor
5A, 5B: constant voltage power supply
8, 16, 17, 18, 26, 27, 28: transmission line
10, 10A, 10B, 10C: power distribution circuit
AMP1, AMP2A, AMP2B: amplifier

The invention claimed is:

1. A power distribution circuit for receiving an input of a pair of differential input signals and outputting a pair of differential output signals, the differential output signals having a positive phase signal and a negative phase signal, the power distribution circuit comprising:
a first unbalance-to-balance transformer, configured to receive an input of the positive phase signal of the pair of differential input signals and to output differential signals;
a second unbalance-to-balance transformer, configured to receive an input of the negative phase signal of the pair of differential input signals and to output differential signals; and
an adding circuit, configured to add the positive phase signals to each other and add the negative phase signals to each other among two pairs of the differential signals outputted from the first and second unbalance-to-balance transformers to thereby output the pair of differential output signals,
wherein the first unbalance-to-balance transformer and the second unbalance-to-balance transformer are connected in parallel to each other.

2. The power distribution circuit according to claim 1, further comprising:
a third unbalance-to-balance transformer, configured to convert an unbalanced input signal into a pair of differential signals and output the pair of differential signals as the pair of differential input signals;
a first amplifier, configured to amplify a positive phase signal of the pair of differential input signals outputted from the third unbalance-to-balance transformer; and
a second amplifier, configured to amplify a negative phase signal of the pair of differential input signals outputted from the third unbalance-to-balance transformer, wherein
the first unbalance-to-balance transformer receives an input of the positive phase signal amplified by the first amplifier, and
the second unbalance-to-balance transformer receives an input of the negative phase signal amplified by the second amplifier.

3. The power distribution circuit according to claim 1, wherein
the first unbalance-to-balance transformer and the second unbalance-to-balance transformer are configured by using a fourth unbalance-to-balance transformer, configured to receive an input of the pair of differential input signals and output two pairs of differential output signals for the positive phase signal and the negative phase signal, respectively.

4. The power distribution circuit according to claim 1, wherein
the first unbalance-to-balance transformer, the second unbalance-to-balance transformer and the adding circuit are configured by using a fifth unbalance-to-balance transformer, configured to combine the positive phase signal of the pair of differential input signals with the positive phase signal and the negative phase signal of the differential output signals, and combine the negative phase signal of the pair of differential input signals with the positive phase signal and the negative phase signal of the differential output signals to thereby output the pair of differential output signals.

5. The power distribution circuit according to claim 3, wherein
the fourth unbalance-to-balance transformer is configured by using transmission lines, and two output transmission lines are combined with one input transmission line so that half of a length of the transmission line to a grounding point from each of input terminals of the pair of differential input signals equals to a length of the transmission line to a grounding point from each of output terminals of the two pairs of differential output signals.

6. The power distribution circuit according to claim 4, wherein
the fifth unbalance-to-balance transformer is configured by using transmission lines, and one output transmission line is combined with two input transmission lines so that half of a length of the transmission line to a grounding point from each of input terminals of the pair of differential input signals equals to a length of the transmission line to a grounding point from each of output terminals of the pair of differential output signals.

7. The power distribution circuit according to claim 1, wherein
a capacitor is disposed between a ground and an input terminal having no input of the first and second unbalance-to-balance transformers, and a constant voltage power supply is provided in parallel to the capacitor.

8. The power distribution circuit according to claim 2, wherein
a capacitor is disposed between a ground and a midpoint between output terminals for the positive phase signal and the negative phase signal of the third unbalance-to-balance transformer, and a constant voltage power supply is provided in parallel to the capacitor.

9. The power distribution circuit according to claim 1, wherein
the adding circuit is configured by using transmission lines, and input signals of same phase components of two positive phase signals and two negative phase signals are summed up in the transmission lines having a same length to thereby extract the pair of differential output signals from a midpoint of the transmission lines.

10. The power distribution circuit according to claim 1, wherein
the adding circuit is configured by using transmission lines, and input signals of different phase components of two positive phase signals and two negative phase signals are summed up in the transmission lines having a same length to thereby extract the pair of differential output signals from the transmission lines.

* * * * *